United States Patent
Ren et al.

(10) Patent No.: US 11,567,397 B2
(45) Date of Patent: Jan. 31, 2023

(54) ELECTRONIC DEVICE

(71) Applicant: BOE Technology Group Co., Ltd., Beijing (CN)

(72) Inventors: Yan Ren, Beijing (CN); Ruirui Suo, Beijing (CN); Xin Liu, Beijing (CN); Zifeng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 291 days.

(21) Appl. No.: 16/907,323

(22) Filed: Jun. 22, 2020

(65) Prior Publication Data
US 2021/0048738 A1 Feb. 18, 2021

(30) Foreign Application Priority Data

Aug. 13, 2019 (CN) .......................... 201910744739.6

(51) Int. Cl.
*G03B 21/58* (2014.01)
*G06F 1/16* (2006.01)
*H05K 1/18* (2006.01)

(52) U.S. Cl.
CPC .......... *G03B 21/58* (2013.01); *G06F 1/1652* (2013.01); *H05K 1/189* (2013.01)

(58) Field of Classification Search
CPC ......... G03B 21/58; G06F 1/1652; G06F 1/16; G09F 9/301; G09F 9/00; G09F 9/33; G09F 9/35; H05K 1/189; H05K 5/0017; H05K 5/0217; H01L 27/3244; H01L 51/0097;

(Continued)

(56) References Cited

U.S. PATENT DOCUMENTS 5,587,051 A * 12/1996 Ostermayer .............. D21F 7/06
356/426
2008/0212271 A1* 9/2008 Misawa .................... G09F 9/35
361/679.01

(Continued)

FOREIGN PATENT DOCUMENTS

CN 204215313 U 3/2015
CN 104536531 A 4/2015

(Continued)

OTHER PUBLICATIONS

Coval Advanced Vacuum Solutions_pp. 1-294_Apr. 2018.*
Office Action dated Dec. 31, 2020 for Chinese Patent Application No. 201910744739.6 and English Translation.

*Primary Examiner* — Timothy J Thompson
*Assistant Examiner* — Guillermo J Egoavil
(74) *Attorney, Agent, or Firm* — Ling Wu; Stephen Yang; Ling and Yang Intellectual Property

(57) ABSTRACT

An electronic device includes: a main body to which a rotating shaft is rotatably connected; a driving motor, provided on the main body, connected to the rotating shaft and configured to drive the rotating shaft to rotate; a flexible display screen, having a first side edge connected to the rotating shaft and capable of completely rolling the flexible display screen onto the rotating shaft or expanding the rolled-up flexible display screen, under a reciprocating rotation of the rotating shaft; and a sucking apparatus provided on the main body and configured to suck the electronic device onto a surface of a carrier.

17 Claims, 8 Drawing Sheets

(58) Field of Classification Search
CPC ............. H01L 51/5237; H01L 51/5253; H01L 51/5259; H01L 2251/5338
USPC ................................................ 361/809, 755
See application file for complete search history.

(56) References Cited

U.S. PATENT DOCUMENTS

| | | | |
|---|---|---|---|
| 2015/0292261 A1* | 10/2015 | Chou | ................ E06B 9/42 160/138 |
| 2016/0187929 A1 | 6/2016 | Kim et al. | |
| 2017/0364122 A1 | 12/2017 | Kim et al. | |
| 2018/0359869 A1* | 12/2018 | Kim | ................ H05K 5/0217 |
| 2020/0267246 A1* | 8/2020 | Song | ................ H05K 1/148 |

FOREIGN PATENT DOCUMENTS

| | | | | |
|---|---|---|---|---|
| CN | 105741683 A | | 7/2016 | |
| CN | 106448465 A | | 2/2017 | |
| CN | 107526188 A | | 12/2017 | |
| CN | 108729831 A | | 11/2018 | |
| GB | 2233808 A | * | 1/1991 | ............ G09F 7/18 |
| KR | 20150055761 A | * | 5/2015 | ............ G09F 9/00 |
| WO | 2006064456 A1 | | 6/2006 | |
| WO | 2017113243 A1 | | 7/2017 | |

\* cited by examiner

ELECTRONIC DEVICE

CROSS-REFERENCE TO RELATED APPLICATION

The present application claims the priority of Chinese Patent Application No. 201910744739.6 filed to the CNIPA on Aug. 13, 2019, the content of which is hereby incorporated by reference.

TECHNICAL FIELD

The embodiments of the present disclosure relate to, but are not limited to, the field of electronic device technology, in particular to an electronic device.

BACKGROUND

With the development of the technology of flexible display screens, many electronic devices have a function of bending or deforming the display screen.

However, at present, the electronic products with flexible display screens generally only have a function of deforming the display screen, but cannot be stored quickly, and the electronic devices cannot be placed randomly. For example, the electronic devices cannot be directly fixed on walls, cabinet surfaces or glass windows, which limits the use scenarios of the electronic devices and cannot meet the usage requirements of the users.

SUMMARY

The following is a summary of the subject matter described in detail herein. This summary is not intended to limit the scope of protection of the claims.

In one aspect, an embodiment of the present disclosure provides an electronic device, including: a main body to which a rotating shaft is rotatably connected; a driving motor provided on the main body, connected to the rotating shaft and configured to drive the rotating shaft to rotate; a flexible display screen having a first side edge connected to the rotating shaft, wherein the flexible display screen is capable of being completely rolled onto the rotating shaft or the rolled-up flexible display screen is capable of being expanded, under a reciprocating rotation of the rotating shaft; and a sucking apparatus provided on the main body and configured to suck the electronic device onto a surface of a carrier.

In some possible implementations, the sucking apparatus of the electronic device includes an air pump and a suction box; the air pump is provided on the main body and connected to the suction box, and is configured to suck air from the suction box; the suction box is provided on the main body, a plurality of air holes are provided in a side wall of the suction box, and the side wall where the air holes are located is combined with the main body to form a portion of a surface of the main body; wherein when the air pump sucks air from the suction box, a surface of the main body provided with the air holes can be sucked onto a surface of a carrier.

In some possible implementations, the main body of the electronic device includes a top surface, and a front surface and a rear surface connected to the top surface, the top surface is located on a side of the rotating shaft away from an expanded flexible display screen, the front surface is a surface facing an image display surface of the flexible display screen in a direction perpendicular to the expanded flexible display screen, and the rear surface is a surface facing away from the image display surface of the flexible display screen in the direction perpendicular to the expanded flexible display screen; wherein the air holes are located on any one of the top surface, the front surface and the rear surface.

In some possible implementations, an elastic sealing strip is provided on a circumferential edge of the surface of the main body of the electronic device provided with the air holes.

In some possible implementations, there are a plurality of suction boxes in the electronic device, and the plurality of suction boxes are disposed on the main body at intervals.

In some possible implementations, the number of air pumps of the electronic device corresponds to the number of suction boxes.

In some possible implementations, the connection between the rotating shaft and the flexible display screen of the electronic device includes adhesive connection, screw connection or clamping connection.

In some possible implementations, the rotating shaft of the electronic device is formed by engaging a first semi-circular shaft with a second semi-circular shaft, a flat surface of the first semi-circular shaft engaged with the second semi-circular shaft is provided with a plurality of protrusions at intervals, a flat surface of the second semi-circular shaft engaged with the first semi-circular shaft is correspondingly provided with a plurality of grooves, and the protrusions are mated with the grooves; a plurality of hanging holes are provided at intervals at the first side edge of the flexible display screen, the plurality of hanging holes are placed over the plurality of protrusions in one-to-one correspondence, and the first side edge of the flexible display screen is sandwiched between the first semi-circular shaft and the second semi-circular shaft.

In some possible implementations, the rotating shaft of the electronic device is formed by engaging a first semi-circular shaft with a second semi-circular shaft, a flat surface of the first semi-circular shaft engaged with the second semi-circular shaft is provided with a plurality of protrusions at intervals, a flat surface of the second semi-circular shaft engaged with the first semi-circular shaft is correspondingly provided with a plurality of grooves, and the protrusions are mated with the grooves; the first side edge of the flexible display screen is connected with a flexible printed circuit (FPC), a plurality of hanging holes are provided in the FPC, the plurality of hanging holes are placed over the plurality of protrusions in one-to-one correspondence, and the FPC is sandwiched between the first semi-circular shaft and the second semi-circular shaft.

In some possible implementations, a plurality of support bars are adhered at intervals to a back surface of the flexible display screen of the electronic device, the support bars are parallel to the rotating shaft, and both ends of the support bar in a length direction are respectively aligned with edges on both sides of the flexible display screen.

In some possible implementations, the support bars of the electronic device are adhered to the back surface of the flexible display screen at uniform intervals.

In some possible implementations, the support bar of the electronic device is made of an alloy.

In some possible implementations, the electronic device further includes a cover having a groove shape; a second side edge of the flexible display screen is opposite to the first side edge, and the second side edge is connected to an inner bottom of the groove-shaped cover; wherein when the driving motor drives the rotating shaft to completely roll the flexible display screen onto the rotating shaft, the cover is engaged with the main body to cover the rotating shaft, the driving motor, the flexible display screen and the sucking apparatus.

In some possible implementations, a first baffle and a second baffle are respectively provided at both ends of the cover of the electronic device in a length direction, and the first baffle and the second baffle are provided with a first adapter and a second adapter, respectively; the first adapter extends from the first baffle toward the second baffle, and the second adapter extends from the second baffle toward the first baffle; wherein an elastic member is provided at a first end on a side of the main body engaged with the cover, and a spring key is provided at a second end on the side of the main body engaged with the cover, the spring key is connected with a processor in the main body, and when the cover is engaged with the main body, the elastic member abuts against the first adapter, and the spring key abuts against the second adapter.

In some possible implementations, the spring key of the electronic device is provided as an expansion control key of the flexible display screen of the electronic device or as an on/off key of the electronic device.

In some possible implementations, the electronic device further includes a voice controller connected to the processor in the main body and configured to send a voice instruction to the processor.

In some possible implementations, the electronic device further includes one or more of the followings: a face recognizer, a temperature detector, a humidity detector, a gravity sensor, a gyroscope and a camera.

In some possible implementations, the main body of the electronic device further includes one or more of the followings: a circuit board, a processor, a memory, a video card, an audio card, a power supply, a stereo and a sensor.

In some possible implementations, the main body of the electronic device has an elongated overall shape.

In some possible implementations, a length of the rotating shaft of the electronic device is adapted to a width or length of the flexible display screen.

The above description is merely a summary of the technical solutions of the present disclosure. Other features and advantages of the present disclosure will be set forth in the following description, and in part will become apparent from the description, or be learned by practice of the present disclosure. Other advantages of the present disclosure may be realized and obtained by the solutions described in the specification, claims and drawings.

Other aspects will become apparent upon reading and understanding the drawings and detailed description.

The reference signs in FIGS. 1 to 12 include:
10-electronic device, 1-main body, 2-rotating shaft, 3-driving motor, 4-flexible display screen, 5-sucking apparatus, 51-air pump, 52-suction box, 521-air hole, 11-top surface, 6-elastic sealing strip, 21-first semi-circular shaft, 22-second semi-circular shaft, 211-protrusion, 221-groove, 41-hanging hole, 7-support bar, 8-cover, 81-first baffle, 82-second baffle, 83-first adapter, 84-second adapter, 12-elastic member, 13-spring key, 14-power supply, 15-stereo, 16-voice controller, 17-non-display area of flexible display screen or FPC.

DETAILED DESCRIPTION

The implementations, structures, features, and effects of the electronic device proposed in accordance with the present disclosure will be described in detail below with reference to the accompanying drawings and embodiments. In the following description, different occurrences of "one embodiment" or "an embodiment" do not necessarily refer to the same embodiment. In addition, specific features, structures, or characteristics in one or more embodiments may be combined in any suitable form.

Figure 1:
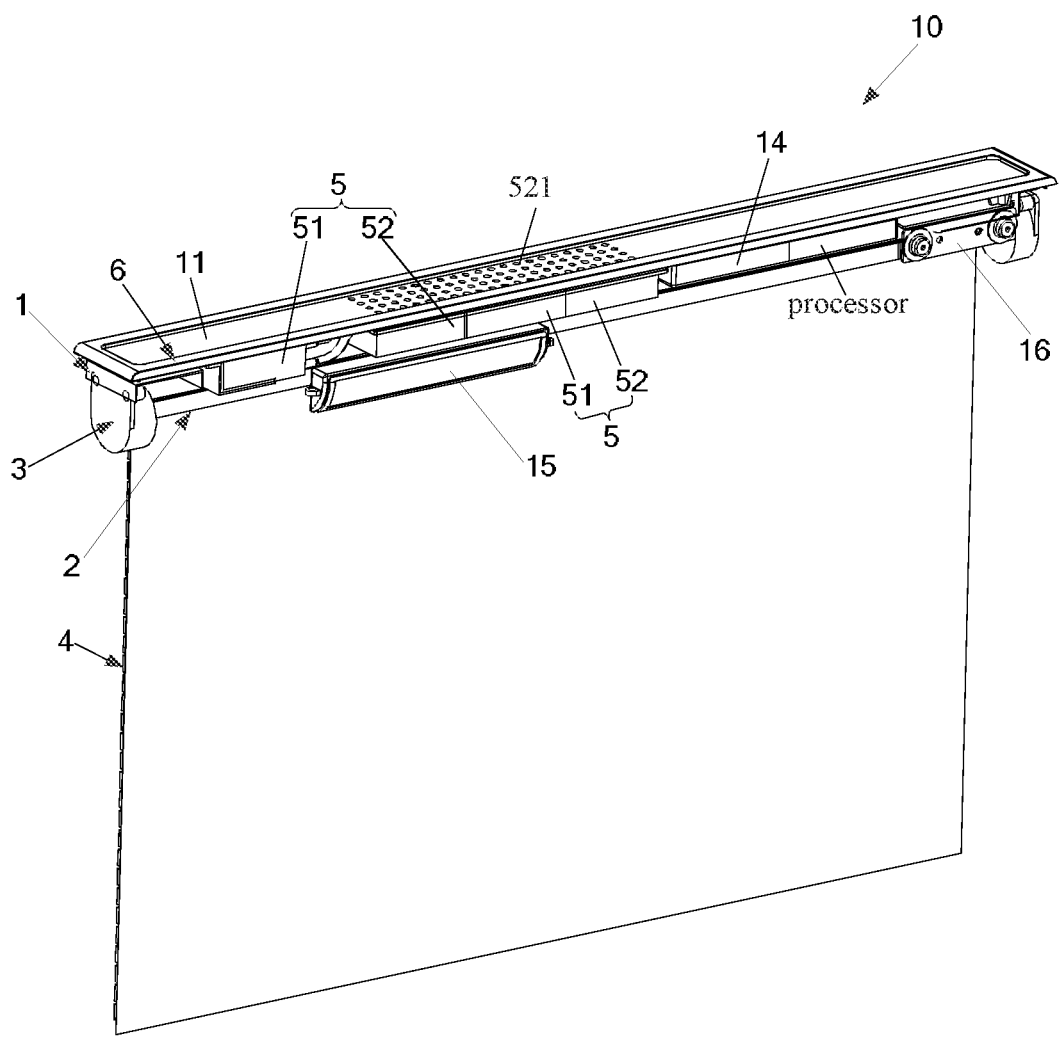
FIG. 1 is a schematic structural view of an electronic device according to an embodiment of the present disclosure.

As shown in FIG. 1, an electronic device 10 according to an embodiment of the present disclosure includes a main body 1, a driving motor 3, a flexible display screen 4, and a sucking apparatus 5. A rotating shaft 2 is rotatably connected to the main body 1. The driving motor 3 is provided on the main body 1, is connected with the rotating shaft 2, and is configured to drive the rotating shaft 2 to rotate. A first side edge of the flexible display screen 4 is connected to the rotating shaft 2, and the flexible display screen 4 can be completely rolled onto the rotating shaft 2 or the rolled-up flexible display screen 4 can be expanded, under a reciprocating rotation of the rotating shaft 2. The sucking apparatus 5 is provided on the main body 1 and is configured to suck the electronic device 10 onto a surface of a carrier.

In an exemplary embodiment, the main body 1 is a portion of the electronic device 10 provided with functional components, for example, provided with one or more of the followings: a circuit board, a processor, a memory, a video card, an audio card, a power supply 14, a stereo 15, various sensors, etc. A portion of the main body 1 for carrying the functional components may be a frame, a shell or a plate. The main body 1 may have an elongated overall shape so as to arrange the rotating shaft 2 for rolling up the flexible display screen 4.

The rotating shaft 2 rotatably connecting to the main body 1 may include providing two brackets respectively at both ends of the main body 1 in the length direction. The rotating shaft 2 is rotatably connected to one bracket, for example, by the cooperation between the shaft and a hole, or by a bearing provided on the bracket. The other bracket fixes the driving motor 3, and is further connected to the other end of the rotating shaft 2 via the driving motor 3, for example, the driving motor 3 is fixed to the bracket through a screw, and then the rotating shaft 2 is connected to a driving end of the driving motor 3 by a coupling. The length of the rotating shaft 2 is adapted to the width or length of the flexible display screen 4, and the power of the driving motor 3 may be selected according to the use requirements.

The flexible display screen 4 is manufactured by a flexible material and can be bent and deformed reciprocally, which, for example, may be a flexible OLED (organic light emitting diode) display screen. The flexible display screen 4 may have a rectangular shape when expanded. The connection between the flexible display screen 4 and the rotating shaft 2 may be realized by adhesive bonding, clamping, screw fixation, or the like. Since the flexible display screen 4 needs to be rolled up or expanded under the rotation of the rotating shaft 2, the connection between the flexible display screen 4 and the processor of the main body 1 may be realized by a FPC (Flexible Printed Circuit). The size of the flexible display screen 4 may be set according to the use requirements, and the structural sizes of the main body 1 and the rotating shaft 2 and the power of the driving motor 3 may also be configured correspondingly.

The sucking apparatus 5 is an apparatus capable of fixing the electronic device 10 onto a surface of a carrier in a suction manner, which may be composed of an air pump 51, and a suction cup or a suction block, etc., and a sucking force is obtained by means of vacuumizing so as to suck the electronic device 10 onto a surface of a carrier. The carrier may be a wall, a table, a chair, a cabinet, a glass window or a mirror.

For the electronic device 10 according to an embodiment of the present disclosure, the flexible display screen 4 is combined with the rotating shaft 2 and the driving motor 3 to form an apparatus capable of rolling up and receiving, and reversely expanding the flexible display screen 4. When the electronic device 10 needs to be stored or carried, the flexible display screen 4 can be rolled up to reduce the overall volume of the electronic device 10, thereby making it convenient for a user to store and carry the electronic device. When the electronic device 10 needs to be used, the driving motor 3 can control the rotating shaft 2 to expand the flexible display screen 4, without requiring a user to manually expand the flexible display screen 4, thereby achieving the effect of facilitating the user's use. In addition, the electronic device 10 may be further provided with a sucking apparatus 5 capable of sucking the electronic device 10 onto a surface of a carrier, for example, sucking the electronic device 10 onto a wall, a glass window or a table, thereby enabling the electronic device 10 to be placed at will without fear of falling of the electronic device 10, and making the electronic device 10 more convenient and safe to use.

As shown in FIGS. 1 to 4, the sucking apparatus 5 includes an air pump 51 and a suction box 52. The air pump 51 is provided on the main body 1 and connected with the suction box 52, and is configured to suck air from the suction box 52. The suction box 52 is provided on the main body 1, a plurality of air holes 521 are provided on a side wall of the suction box 52, and the side wall where the air holes 521 are located is combined with the main body 1 to form a portion of a surface of the main body 1. When the air pump 51 sucks air from the suction box 52, the surface of the main body 1 provided with the air holes 521 can be sucked onto a surface of a carrier.

In an exemplary embodiment, a suction end of the air pump 51 may be connected to the suction box 52 through a pipe, and the air pump 51 may be mounted on the main body 1 through a support seat, or may be directly fixed to the main body 1 using a bolt. The suction box 52 is sealed, leaving only a through hole connected with the air pump 51 and air holes 521 for suction, so that after the air pump 51 sucks air from the suction box 52, a negative pressure lower than atmospheric pressure can be generated in the suction box 52. In addition, at least one surface of the suction box 52 needs to be a flat surface on which the plurality of air holes 521 are provided, and at least one of outer surfaces of the main body 1 also needs to be a flat surface, so that after the suction box 52 is mounted on the main body 1, the flat surface of the suction box 52 provided with the air holes 521 can be combined with the flat surface of the outer surfaces of the main body 1 to form a flat surface for suction, so as to facilitate sucking the electronic device 10 onto a surface of a carrier through the combined flat surface.

By means of the sucking apparatus 5 formed by the air pump 51 and the suction box 52, when the electronic device 10 needs to be sucked onto a surface of a carrier, the air pump 51 is controlled to suck air from the suction box 52 so that the electronic device 10 can be sucked onto the surface of the carrier; and when the electronic device 10 needs to be removed from the surface of the carrier, it is only needed to control the air pump 51 to suck air reversely, i.e., inject air into the suction box 52. Air suction of the air pump 51 can be controlled by the processor in the main body 1.

In an exemplary embodiment, as shown in FIGS. 1 to 4, a main carrier of the main body 1 may be a support and may have at least one of a top surface 11, a front surface and a rear surface. When the main body includes the top surface, the front surface and the rear surface, the front surface and the rear surface are respectively connected to the top surface. The top surface 11 is located above the flexible display screen 4, i.e. located on a side of the rotating shaft away from the expanded flexible display screen. The front surface corresponds to an image display surface of the flexible display screen 4, i.e. the front surface is a surface facing the image display surface of the flexible display screen 4 in a direction perpendicular to the expanded flexible display screen 4. The front surface corresponds to the front of the electronic device 10. The rear surface corresponds to a back surface of the flexible display screen 4, i.e., the rear surface is a surface facing away from the image display surface of the flexible display screen 4 in the direction perpendicular to the expanded flexible display screen 4. The rear surface corresponds to the back of the electronic device 10. The top surface 11, the front surface and the rear surface are all flat surfaces. In this way, the surface of the suction box 52 provided with a plurality of air holes 521 can be combined with any one of the top surface 11, the front surface and the rear surface to form a surface for suction. After the above combination, the electronic device 10 can be sucked onto a surface of a carrier through the top, for example, onto a ceiling or onto a top glass cover plate inside a glass cabinet; alternatively, the electronic device 10 may be sucked onto a surface of a carrier through the front surface, for example, onto the glass of a window for displaying information to the outside; alternatively, the electronic device 10 may be sucked onto a surface of a carrier through the rear surface, for example, onto a wall.

Figure 2:
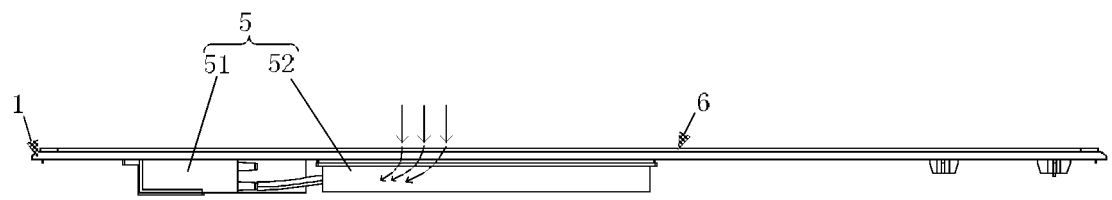
FIG. 2 is a side view of a sucking apparatus provided on a main body of an electronic device according to an embodiment of the present disclosure.
Figure 3:
FIG. 3 is a bottom view of a sucking apparatus provided on a main body of an electronic device according to an embodiment of the present disclosure.
Figure 4:
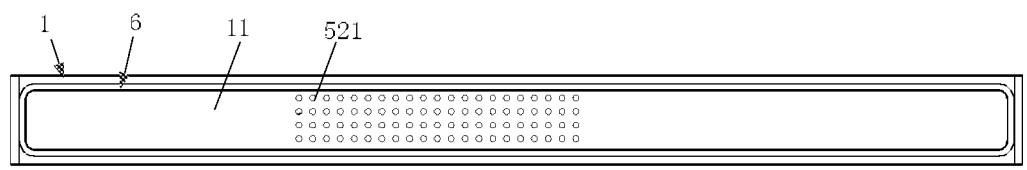
FIG. 4 is a top view of an electronic device according to an embodiment of the present disclosure.

As shown in FIGS. 1, 2 and 4, in an exemplary embodiment, in order to stably suck the surface of the main body 1 provided with a plurality of air holes 521 onto a carrier, an elastic sealing strip 6, e.g., a silicone sealing strip, may be provided on the circumferential edge of the surface of the main body 1 provided with the air holes 521, so that after the air pump 51 sucks the gas from the suction box 52, a suction force is generated between the surface of the main body 1 provided with the air holes 521 and a surface of the carrier. This suction force can press the elastic sealing strip 6 to deform to form a seal between the surface of the main body 1 provided with the air holes 521 and the surface of the carrier, thereby ensuring a good sucking effect.

In an exemplary embodiment, there may be a plurality of suction boxes 52, and the plurality of suction boxes 52 may be disposed on the main body 1 at intervals.

In an exemplary embodiment, the electronic device 10 may be configured to have a desired display area according to the use requirements, i.e., the flexible display screen 4 may be configured to have a desired size, and the main body 1 and the rotating shaft 2 are configured accordingly to have desired structural sizes. When the electronic device 10 has a relatively large size, there may be a plurality of suction boxes 52, and the plurality of suction boxes 52 are disposed on the main body 1 at uniform intervals, so that the suction force generated by the plurality of suction boxes 52 under the action of the air pump 51 can firmly suck the electronic device 10 with a relatively large size onto a surface of a carrier, thereby ensuring the safety of use. Furthermore, in order to cooperate with the plurality of suction boxes 52, a corresponding number of air pumps 51 may be provided, which are connected to the suction boxes 52 one by one.

Figure 5:
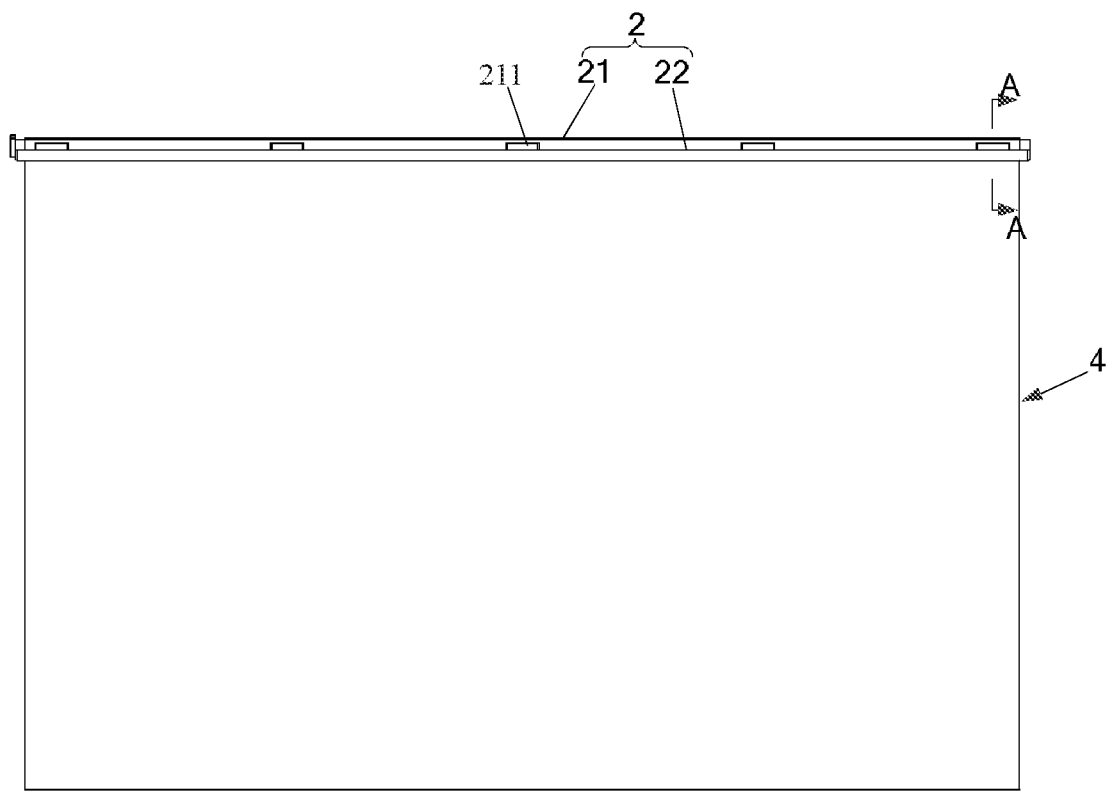
FIG. 5 is a schematic structural view of a rotating shaft of an electronic device mated with a flexible display screen according to an embodiment of the present disclosure.
Figure 6:
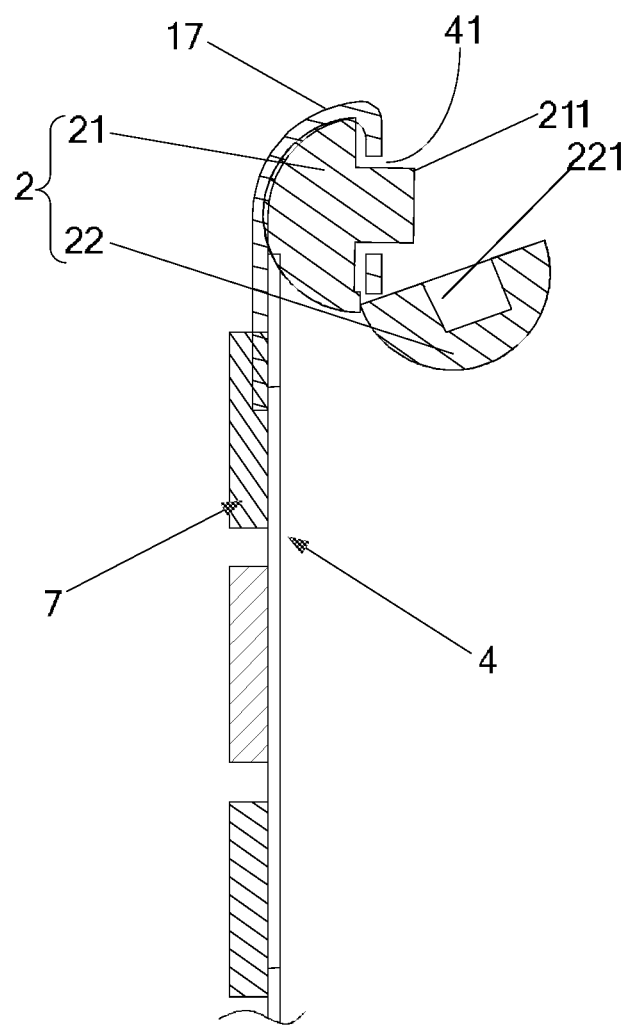
FIG. 6 is a schematic sectional view taken at position A-A in FIG. 5.
Figure 7:
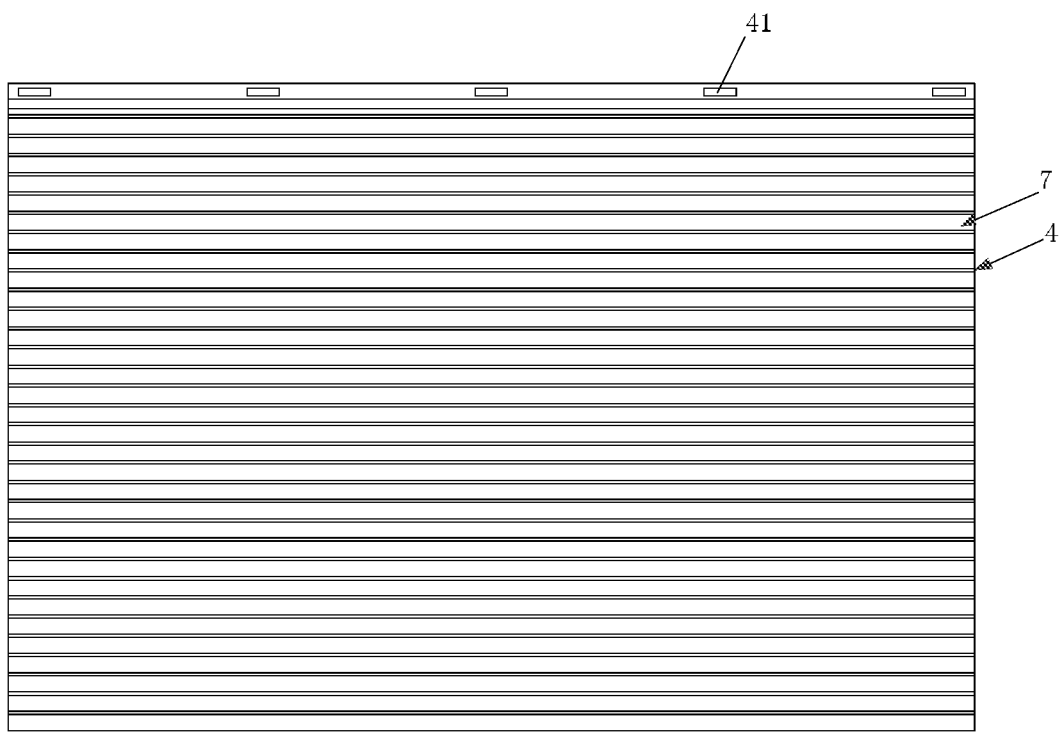
FIG. 7 is a schematic structural view of a back surface of a flexible display screen of an electronic device according to an embodiment of the present disclosure.

As shown in FIGS. 5 to 7, in an exemplary embodiment, the rotating shaft 2 can be formed by engaging a first semi-circular shaft 21 with a second semi-circular shaft 22, a flat surface of the first semi-circular shaft 21 engaged with the second semi-circular shaft 22 is provided with a plurality of protrusions 211 at intervals, a flat surface of the second semi-circular shaft 22 engaged with the first semi-circular shaft 21 is provided correspondingly with a plurality of grooves 221, and the protrusions 211 are mated with the grooves 221. A plurality of hanging holes 41 are provided at intervals on the first side edge of the flexible display screen 4, the plurality of hanging holes 41 are placed over the plurality of protrusions 211 in one-to-one correspondence, and the first side edge of the flexible display screen 4 is sandwiched between the first semi-circular shaft 21 and the second semi-circular shaft 22.

The connection between the rotating shaft 2 and the flexible display screen 4 may be adhesive connection, screw connection or the above-mentioned clamping connection. The clamping connection has the characteristic of facilitating disassembly and maintenance. The first semi-circular shaft 21 and the second semi-circular shaft 22 may each have a semi-cylindrical structure, and form a complete cylindrical rotating shaft 2 after being engaged with each other. The protrusion 211 provided on the engagement flat surface of the first semi-circular shaft 21 may be a cylinder, a rectangular column or a tapered column. The groove 221 provided on the engagement flat surface of the second semi-circular shaft 22 needs to be adapted to the structure of the protrusion 211 so that the groove 221 and the protrusion 211 can be engaged. The plurality of hanging holes 41 provided on the first side edge of the flexible display screen 4 are located in a non-display area of the flexible display screen 4. Alternatively, a FPC (Flexible Printed Circuit) may be connected to the first side edge of the flexible display screen 4, the FPC is provided with a plurality of hanging holes 41 placed over the plurality of protrusions in one-to-one correspondence. The FPC is sandwiched between the first semi-circular shaft and the second semi-circular shaft, and the flexible display screen 4 is connected to the processor in the main body 1 through the FPC. The position 17 shown in FIG. 6 may be the non-display area of the flexible display screen 4 or may be a FPC.

As shown in FIGS. 6 and 7, in an exemplary embodiment, a plurality of support bars 7 may be adhered at intervals to the back surface of the flexible display screen 4, and the support bars 7 are parallel to the rotating shaft 2. Optionally, the support bars 7 may be adhered to the back surface of the flexible display screen at uniform intervals. Optionally, both ends of the support bar 7 in the length direction may be respectively aligned with the edges on both sides of the flexible display screen 4. Optionally, any one of the support bars 7 as shown in FIG. 7 may include support bars provided at intervals in the length direction, that is, any one of the support bars may include a plurality of sub-support bars.

In an exemplary embodiment, due to the flexibility of the flexible display screen 4 itself, when the flexible display screen 4 is expanded reversely after being rolled up, the flexible display screen 4 itself will bend. In order to enable the flexible display screen 4 to be expanded more flatly, a plurality of support bars 7 can be disposed at intervals on the back surface of the flexible display screen 4. In order to ensure normal roll-up of the flexible display screen 4, the support bars 7 can be parallel to the rotating shaft 2. For the sake of good expansion of the flexible display screen 4, the support bar 7 may be configured to have a length equal to the width or length of the flexible display screen 4 in a direction parallel to the rotating shaft 2, and have both ends aligned with both side edges of the flexible display screen 4, respectively. The support bar 7 may be a flat bar made of an alloy.

Figure 8:
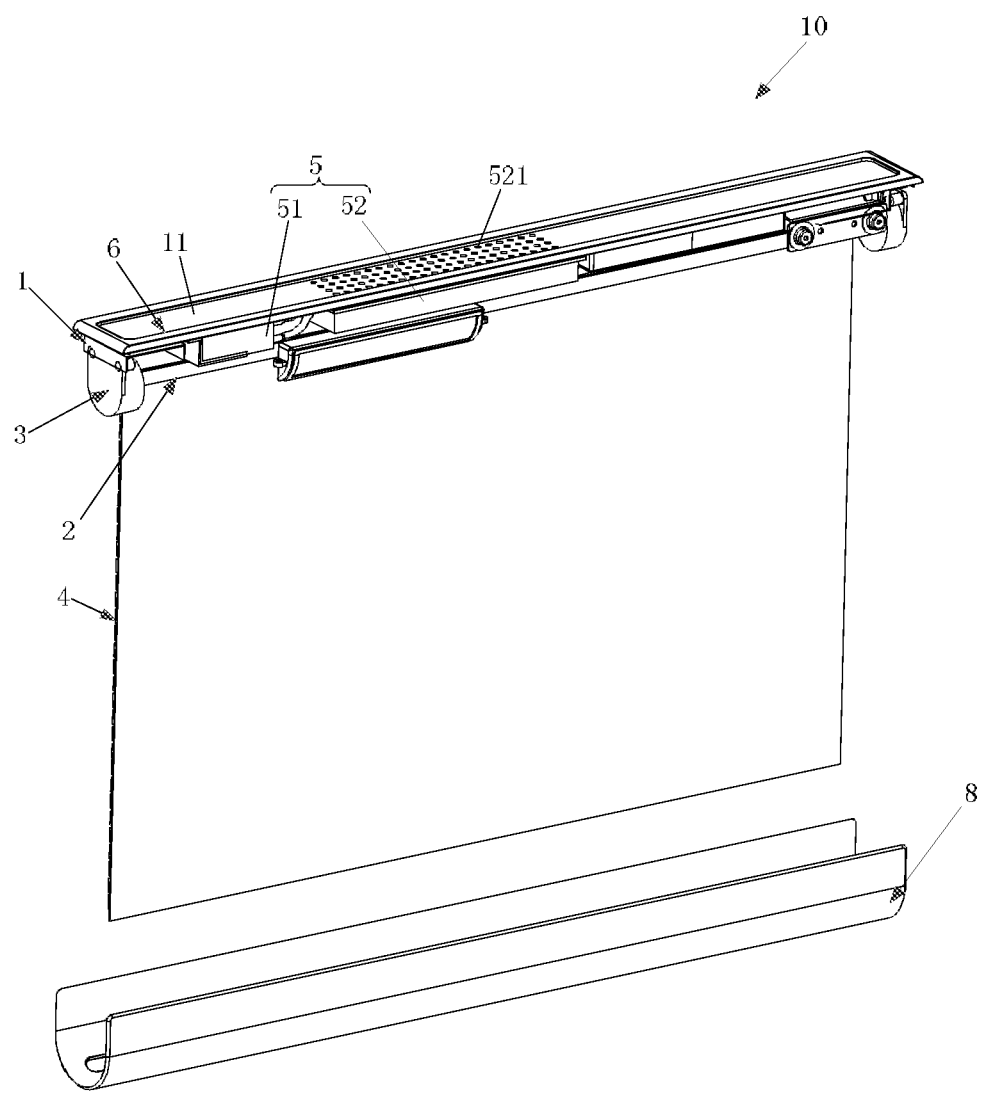
FIG. 8 is a schematic structural view of another electronic device according to an embodiment of the present disclosure.
Figure 9:
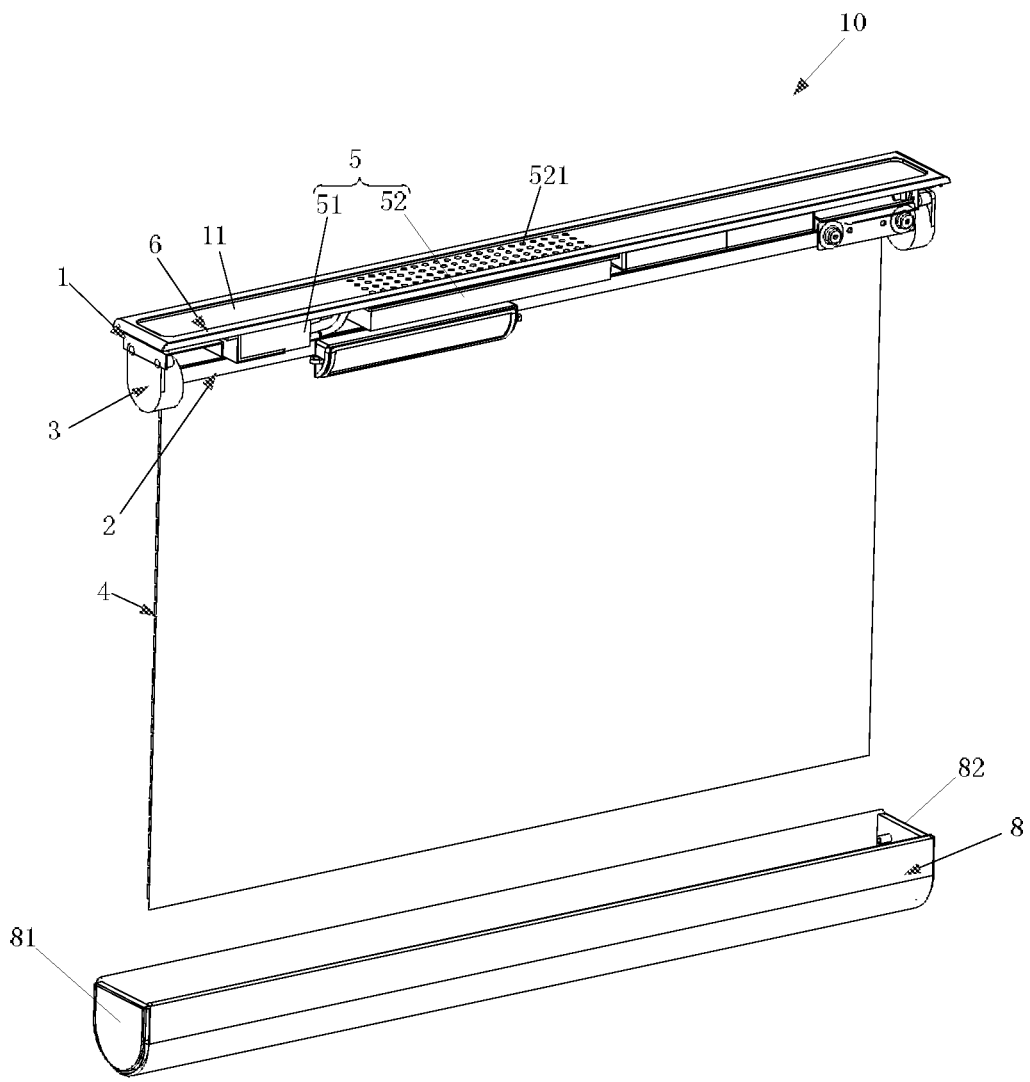
FIG. 9 is a schematic structural view of a further electronic device according to an embodiment of the present disclosure.
Figure 10:
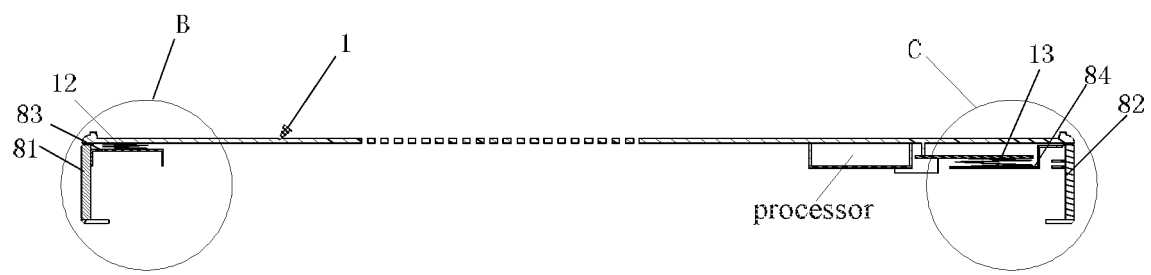
FIG. 10 is a schematic structural sectional view of junctions of first and second baffles and a main body of the electronic device provided in FIG. 9.
Figure 11:
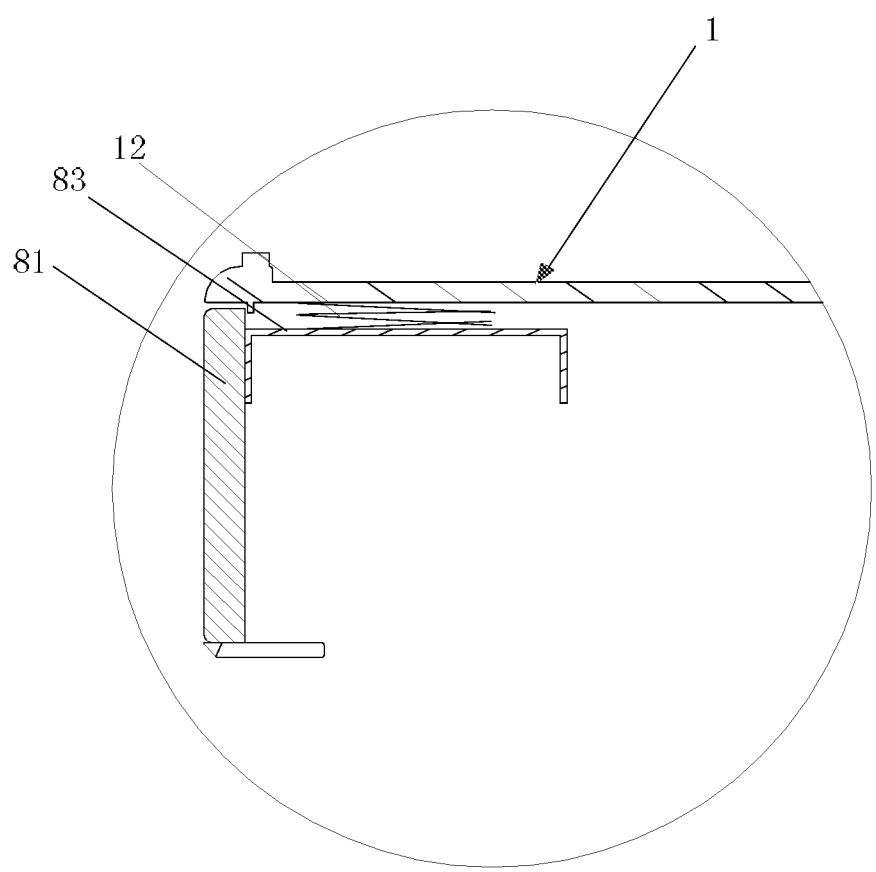
FIG. 11 is an enlarged view at position B in FIG. 10.
Figure 12:
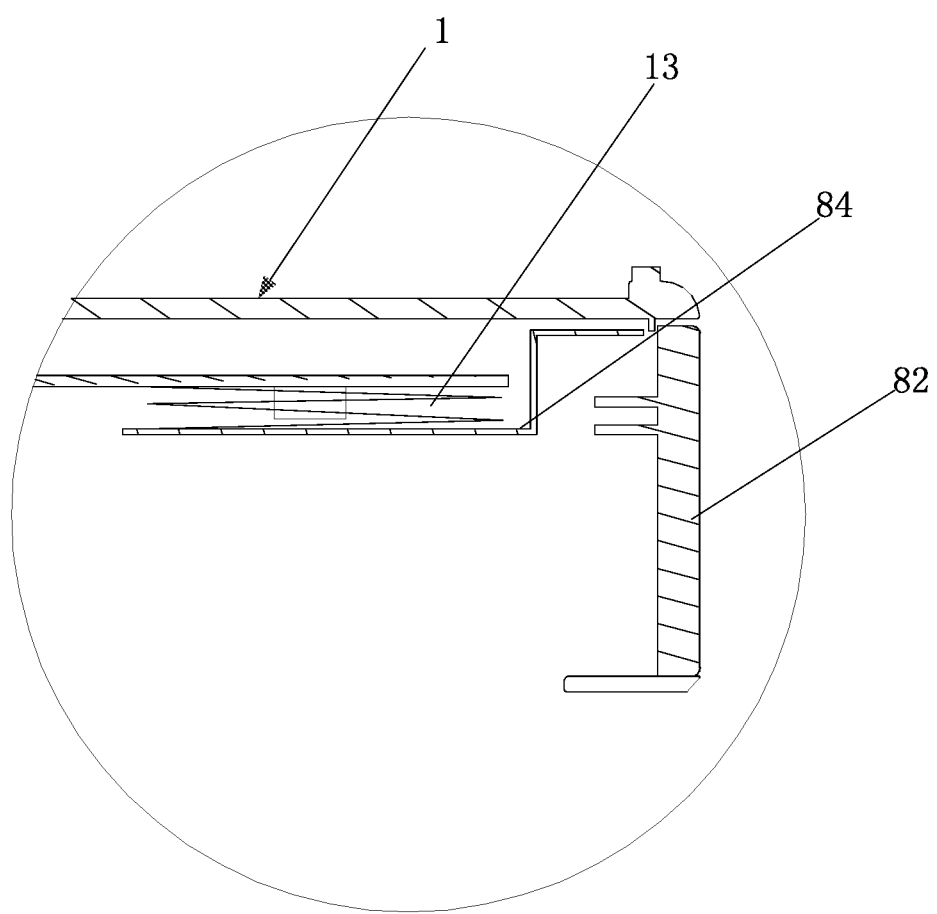
FIG. 12 is an enlarged view at position C in FIG. 10.

As shown in FIG. 8, in an exemplary embodiment, the electronic device 10 according to an embodiment of the present disclosure may further include: a cover 8 which may have a groove shape, a second side edge of the flexible display screen 4 being opposite to the first side edge, and the second side edge being connected with an inner bottom of the groove-shaped cover 8. When the driving motor 3 drives the rotating shaft 2 to roll the entire flexible display screen 4 onto the rotating shaft 2, the cover 8 is engaged with the main body 1 to cover the rotating shaft 2, the driving motor 3, the flexible display screen 4 and the sucking apparatus 5.

In an exemplary embodiment, the main carrier of the main body 1 may be configured to have a structure of a flat plate or a cover shell, so as to be able to engage with the cover 8 to form a sealed space for receiving and covering the rotating shaft 2, the driving motor 3, the flexible display screen 4, and the structures in the main body 1 such as the mainboard, the processor, the memory and the like.

As shown in FIGS. 9 to 12, in an exemplary embodiment, a first baffle 81 and a second baffle 82 are respectively provided at both ends of the cover 8 in the length direction. The first baffle 81 and the second baffle 82 are respectively provided with a first adapter 83 and a second adapter 84. The first adapter 83 extends from the first baffle 81 toward the second baffle 82, and the second adapter 84 extends from the second baffle 82 toward the first baffle 81. An elastic member 12 is provided at a first end on a side of the main body 1 engaged with the cover 8, and a spring key 13 is provided at a second end on the side of the main body 1 engaged with the cover 8. The spring key 13 is connected with the processor in the main body 1. When the cover 8 is engaged with the main body 1, the elastic member 12 abuts against the first adapter 83, and the spring key 13 abuts against the second adapter 84.

The first baffle 81 and the second baffle 82 together with the cover 8 constitute a grooved shell with both ends blocked, which, when engaged with the main body 1, can receive and cover the rotating shaft 2, the driving motor 3, the flexible display screen 4, and the structures in the main body 1 such as the mainboard, the processor, the memory and the like, and can partially cover the main body 1. When the cover 8 is engaged with the main body 1, the first adapter 83 provided on the first baffle 81 can abut against the elastic member 12, and the second adapter 84 can abut against the spring key 13, so that there is a certain compression stroke between the main body 1 and the cover 8, which avoids rigid extrusion therebetween. Furthermore, the spring key 13 can be used as a flexible screen expansion control key of the electronic device 10 or as an on/off key of the electronic device 10. When the flexible display screen 4 needs to be expanded, it is only needed to push the cover 8 towards the main body 1, so that the second adapter 84 presses the spring key 13. The elastic member 12 may be an elastic piece or a spring, and the spring key 13 may be a push switch with certain elasticity.

In an exemplary embodiment, the electronic device 10 according to an embodiment of the present disclosure may further include a voice controller 16 connected to the processor in the main body 1 and configured to send a voice instruction to the processor.

For example, the voice controller may be configured as a controller capable of recognizing a user's voice and converting the voice into a corresponding functional instruction. By providing the voice controller, it is possible to realize voice control of the electronic device 10, e.g., voice control of rolling up or expanding of the flexible display screen 4.

Further, the electronic device 10 according to an embodiment of the present disclosure may also include a variety of intelligent components, which, for example, include but are not limited to one or more of the followings: a face recognizer, a temperature detector, a humidity detector, a gravity sensor, a gyroscope, a camera, etc.

The above are merely exemplary embodiments of the present disclosure, which are not intended to limit the present disclosure in any form. Any simple amendment, equivalent variation and modification made to the above embodiments according to the technical substance of the present disclosure shall be covered by the scope of the technical solutions of the present disclosure.

What we claim is:

1. An electronic device, comprising:
a main body to which a rotating shaft is rotatably connected;
a driving motor, provided on the main body, connected to the rotating shaft and configured to drive the rotating shaft to rotate;
a flexible display screen, having a first side edge connected to the rotating shaft, wherein the flexible display screen is capable of being completely rolled onto the rotating shaft or the rolled-up flexible display screen is capable of being expanded under a reciprocating rotation of the rotating shaft; and
a sucking apparatus provided on the main body and configured to suck the electronic device onto a surface of a carrier;
a cover having a groove shape;
wherein a second side edge of the flexible display screen is opposite to the first side edge, and the second side edge is connected to an inner bottom of the groove-shaped cover,
wherein when the driving motor drives the rotating shaft to completely roll the flexible display screen onto the rotating shaft, the cover is engaged with the main body to cover the rotating shaft, the driving motor, the flexible display screen and the sucking apparatus,
wherein a first baffle and a second baffle are respectively provided at both ends of the cover in a length direction, and the first baffle and the second baffle are provided with a first adapter and a second adapter, respectively, the first adapter extends from the first baffle toward the second baffle, and the second adapter extends from the second baffle toward the first baffle, and
wherein an elastic member is provided at a first end on a side of the main body engaged with the cover, and a spring key is provided at a second end on the side of the main body engaged with the cover, the spring key is connected with a processor in the main body, and when the cover is engaged with the main body, the elastic member abuts against the first adapter, and the spring key abuts against the second adapter.

2. The electronic device according to claim 1, wherein the sucking apparatus comprises an air pump and a suction box;
the air pump is provided on the main body and connected to the suction box, and is configured to suck air from the suction box;
the suction box is provided on the main body, a plurality of air holes are provided in a side wall of the suction box, and the side wall where the air holes are located is combined with the main body to form a portion of a surface of the main body;
wherein when the air pump sucks air from the suction box, a surface of the main body provided with the air holes is able to be sucked onto a surface of a carrier.

3. The electronic device according to claim 2, wherein the main body comprises a top surface, and a front surface and a rear surface connected to the top surface, the top surface is located on a side of the rotating shaft away from an expanded flexible display screen, the front surface is a surface facing an image display surface of the flexible display screen in a direction perpendicular to the expanded flexible display screen, and the rear surface is a surface facing away from the image display surface of the flexible display screen in the direction perpendicular to the expanded flexible display screen;
wherein the air holes are located in any one of the top surface, the front surface and the rear surface.

4. The electronic device according to claim 2, wherein an elastic sealing strip is provided on a circumferential edge of the surface of the main body provided with the air holes.

5. The electronic device according to claim 2, wherein there are a plurality of suction boxes, and the plurality of suction boxes are disposed on the main body at intervals.

6. The electronic device according to claim 5, wherein the number of air pumps corresponds to the number of suction boxes.

7. The electronic device according to claim 1, wherein the connection between the rotating shaft and the flexible display screen includes adhesive connection, screw connection or clamping connection.

8. The electronic device according to claim 1, wherein the rotating shaft is formed by engaging a first semi-circular shaft with a second semi-circular shaft, a flat surface of the first semi-circular shaft engaged with the second semi-circular shaft is provided with a plurality of protrusions at intervals, a flat surface of the second semi-circular shaft engaged with the first semi-circular shaft is correspondingly provided with a plurality of grooves, and the protrusions are mated with the grooves;

a plurality of hanging holes are provided at intervals at the first side edge of the flexible display screen, the plurality of hanging holes are placed over the plurality of protrusions in one-to-one correspondence, and the first side edge of the flexible display screen is sandwiched between the first semi-circular shaft and the second semi-circular shaft.

9. The electronic device according to claim 1, wherein the rotating shaft is formed by engaging a first semi-circular shaft with a second semi-circular shaft, a flat surface of the first semi-circular shaft engaged with the second semi-circular shaft is provided with a plurality of protrusions at intervals, a flat surface of the second semi-circular shaft engaged with the first semi-circular shaft is correspondingly provided with a plurality of grooves, and the protrusions are mated with the grooves;

the first side edge of the flexible display screen is connected with a flexible printed circuit (FPC), a plurality of hanging holes are provided in the FPC, the plurality of hanging holes are placed over the plurality of protrusions in one-to-one correspondence, and the FPC is sandwiched between the first semi-circular shaft and the second semi-circular shaft.

10. The electronic device according to claim 1, wherein a plurality of support bars are adhered at intervals to a back surface of the flexible display screen, the support bars are parallel to the rotating shaft, and both ends of the support bar in a length direction are respectively aligned with edges on both sides of the flexible display screen.

11. The electronic device according to claim 10, wherein the support bars are adhered to the back surface of the flexible display screen at uniform intervals.

12. The electronic device according to claim 10, wherein the support bar is made of an alloy.

13. The electronic device according to claim 1, wherein the spring key is provided as an expansion control key of the flexible display screen of the electronic device or as an on/off key of the electronic device.

14. The electronic device according to claim 1, further comprising a voice controller connected to a processor in the main body and configured to send a voice instruction to the processor.

15. The electronic device according to claim 1, wherein the main body further comprises one or more of the followings: a circuit board, a processor, a memory, a video card, an audio card, a power supply, a stereo and a sensor.

16. The electronic device according to claim 1, wherein the main body has an elongated overall shape.

17. The electronic device according to claim 1, wherein a length of the rotating shaft is adapted to a width or length of the flexible display screen.

\* \* \* \* \*